United States Patent [19]

Vella

[11] Patent Number: 5,146,186
[45] Date of Patent: Sep. 8, 1992

[54] PROGRAMMABLE-STEP, HIGH-RESOLUTION FREQUENCY SYNTHESIZER WHICH SUBSTANTIALLY ELIMINATES SPURIOUS FREQUENCIES WITHOUT ADVERSELY AFFECTING PHASE NOISE

[75] Inventor: Paul L. Vella, Santa Rosa, Calif.
[73] Assignee: Microsource, Inc., Santa Rose, Calif.
[21] Appl. No.: 699,625
[22] Filed: May 13, 1991
[51] Int. Cl.$^5$ .......................... H03L 7/07; H03L 7/16; H03L 7/22
[52] U.S. Cl. ...................................... 331/16; 331/11; 331/18; 331/19; 455/260
[58] Field of Search ............ 331/1 A, 10, 11, 16, 331/7, 18, 19, 25; 455/260

[56] References Cited

U.S. PATENT DOCUMENTS

| | | | |
|---|---|---|---|
| 4,516,084 | 5/1985 | Crowley | 331/2 |
| 4,568,888 | 2/1986 | Kimura et al. | 331/10 |
| 4,602,220 | 7/1986 | Kurihara | 331/19 |
| 4,720,688 | 1/1988 | Hasegawa et al. | 331/16 X |
| 4,728,906 | 3/1988 | Turl et al. | 331/16 X |
| 4,763,083 | 8/1988 | Edwards | 331/16 X |
| 4,791,387 | 12/1988 | Hasegawa et al. | 331/16 X |
| 4,839,603 | 6/1989 | Mower et al. | 331/2 X |
| 4,845,443 | 7/1989 | Stankey | 331/19 X |
| 4,951,004 | 8/1990 | Sheffer et al. | 331/1 A |
| 4,963,838 | 10/1990 | Hareyama | 331/2 |
| 4,965,533 | 10/1990 | Gilmore | 331/18 |
| 5,015,971 | 5/1991 | Taylor et al. | 331/19 X |
| 5,053,722 | 10/1991 | Kuo et al. | 331/2 |

*Primary Examiner*—David Mis
*Attorney, Agent, or Firm*—Townsend and Townsend

[57] ABSTRACT

A frequency synthesizer is described which operates over a wide frequency range at high resolution and variable step size without trading off between spurious frequency rejection and phase noise suppression. The synthesizer includes a magnetically-turned YIG oscillator which generates a desired output frequency from a received tuning signal. The output signal is fed back into a phase locked loop which generates the tuning signal. The phase locked loop includes a harmonic mixer for mixing the output signal with a reference frequency $F_2$. The mixer receives a base frequency signal and a harmonic select signal resulting in the generation of the reference signal, $F_2$. The mixed signal is input to a programmable divider, then to a phase detector which receives another reference signal, $F_1$. The phase detector output is the tuning signal which is coupled to the YIG oscillator. Both reference frequencies, $F_1$ and $F_2$, are derived from a common base frequency. A base frequency source includes a voltage-controller oscillator coupled to another phase locked loop. This other phase locked loop receives two reference signals, $F_x$ and $F_y$. Reference $F_x$ preferably is generated by a direct digital synthesizer that receives programmable tuning parameters. Reference $F_y$ may be generated with a fixed, switched or other frequency source. A microprocessor is included for selecting the programmable divider factors, the direct digital synthesizer tuning parameters, and other variable factors.

19 Claims, 6 Drawing Sheets

PROGRAMMABLE-STEP, HIGH-RESOLUTION FREQUENCY SYNTHESIZER WHICH SUBSTANTIALLY ELIMINATES SPURIOUS FREQUENCIES WITHOUT ADVERSELY AFFECTING PHASE NOISE

BACKGROUND OF THE INVENTION

This invention relates to frequency synthesizers for radio frequency, microwave or gigahertz applications in which spurious frequencies are to be reduced or eliminated. Previously frequency synthesizers operating in the microwave or gigahertz range have faced a compromise between frequency range resolution and phase noise. This invention relates to a frequency synthesizer which may operate over a wide frequency range at high resolution and variable step size without trading off between spurious frequency rejection and phase noise suppression.

A frequency synthesizer is a circuit for generating a desired output frequency from one or more input frequencies. Typically, the output frequency is stabilized and phase locked to a reference frequency. In the past the synthesizer designer has needed to make comprises trading-off one area of performance for another. For example, in designing a direct digital synthesizer the process of converting the digital signals to analog waveforms causes spurious outputs. The magnitude of these spurious outputs relative to the carrier frequency increases rapidly as the output frequency increases, limiting the usefulness of such synthesizers for the gigahertz frequency range. When such a direct digital synthesizer includes a phase locked oscillator, an undesirable tradeoff between spurious outputs and phase noise often results.

Direct synthesizers achieve fast switching speeds by using combinations of arithmetic functions such as division, multiplication and mixing of a stable signal to achieve a desired output frequency. Such synthesizers, however, have been unable to achieve such performance with a small-sized system or with low phase noise and low spurious outputs. In addition, such synthesizers may suffer from high power consumption and poor frequency resolution.

Conventional synthesizers used for telecommunications or satellite communications typically are tunable over a very narrow frequency band. The architecture for such synthesizers is based on a VHF synthesizer/multiplier/upconverter approach. A varactor tuned oscillator often is used in which the oscillator Q and phase noise are inversely dependent on the tuning range. Phase noise is compromised limiting the synthesizers to a narrow operating range.

Accordingly, conventional synthesizers often are limited to a narrow frequency range over which spurious frequencies are sufficiently rejected. Tuning such a synthesizer to operate outside a select range results in unsatisfactory spurious output performance. Typically, hardware changes (system design changes) are needed to alter the operating range. Changes to the step size for tuning the oscillator also may require hardware design changes, resulting in recurring engineering charges.

FIG. 1 shows a PLL implementation of a synthesizer 10, in which a reference signal $F_1$ and a programmed divider value N are input and a frequency-referenced, phase-referenced signal $F_0$ is output. The synthesizer 10 includes a tuned oscillator 12, a power splitter 14, a buffer 16, a programmable frequency divider 18, a phase detector 20, a loop amplifier 22 and a loop filter 24. The frequency of the output signal $F_0$ equals the programmed divider count, N, times the frequency of the reference signal $F_1$. Such an implementation suffers from a trade-off between output frequency step size and phase noise, along with a limited maximum output frequency.

For higher frequency implementations, such as for a microwave frequency synthesizer 10' as shown in FIG. 2, a second source 26 often is included in the feedback path. Also added are a mixer element 28, a loop filter 30 and another buffer 32. The second source 26 generates a signal $F_2$ used for mixing the output signal $F_0$ so as to provide frequency increments between harmonics of the reference signal $F_1$. The second source 26 may be another phase locked loop oscillator generating a select reference frequency, or may be a fixed reference signal source, or may be a switched reference signal source.

Use of a harmonic mixer (e.g., sampler) for the mixer element 28 also is known. A harmonic mixer reduces the required frequency $F_2$, enabling such frequency to be in the VHF range. In addition, a narrower tuning range of the source 26 occurs, because the operating harmonic of the mixer can be incremented for large frequency steps.

In embodiments which employ mixing of multiple reference signals (i.e., $F_1$ and $F_2$), the resulting mixing product terms include not only the desired term, but product terms between the harmonics of $F_1$ and $F_2$. Such additional terms are "spurious frequencies". Such spurious frequencies may occur at very small offsets from the frequency of the desired term. Filtering such spurious frequencies requires a filter passband which is too narrow for a practical high frequency synthesizer. In addition, the step size between potential output signal frequencies would need to be unreasonably large to allow such narrow passbands.

As a result, the conventional way of reducing spurious frequency effects has been to reduce the drive of the mixer. Such an approach, however, adversely impacts the signal to noise ratio and the phase noise "floor" of the feedback loop. Thus, conventional high frequency synthesizer designs have been subject to a tradeoff between phase noise and spurious frequency performance.

Accordingly, there is a need for a high frequency synthesizer which improves both spurious frequency rejection and phase noise suppression. Further, there is a need for a synthesizer which can achieve such performance without sacrificing step size, physical size, weight or power consumption.

SUMMARY OF THE INVENTION

In a frequency synthesizer which mixes multiple reference frequencies for generating a desired output signal frequency, a high-quality, tunable output is generated by a high-frequency, wide-band tunable oscillator and specifically, by a magnetically-tuned YIG oscillator, which is coupled to a phase-compared control loop which receives a pair of commonly derived reference frequencies. A base frequency is input to a multiplier and programmable divider for forming a first reference frequency. The control loop forms a phase locked loop controlled by a second reference frequency which is a harmonic of the base frequency. The phase-compared control loop includes a harmonic mixer wherein the output signal of the oscillator is coupled in feedback to the harmonic mixer. The harmonic mixer mixes the output signal with the second reference frequency signal, $F_2$, and the mixed signal then is frequency divided in a variable programmable divider and input as a second phase reference to the phase comparator. The phase comparator receives the divided reference signal and the first reference frequency, $F_1$, which is used to regulate the phase of the divided signal, so as to generate a signal for tuning the oscillator. When the loop locks, the output signal of the direct oscillator is both phase-referenced and frequency-referenced at a desired frequency determined by the reference signals $F_1$ and $F_2$, the mixer harmonic, and the programmed divider factor. By use of coherent reference frequencies, spurious frequency levels are substantially reduced or eliminated according to this invention without adversely impacting phase noise. The frequency synthesizer of this invention has a wide operating frequency range, variable step size and high resolution.

According to one aspect of the invention, the reference frequencies are derived from a common base frequency. By commonly deriving the reference frequencies, the lowest spurious frequency in the feedback loop is the lowest common factor of the reference frequencies. In the prior art implementations previously discussed, there is no significant relationship between the reference frequencies. As a result, spurious frequency terms exist at small offsets from the output signal frequency. According to this invention, however, spurious frequencies occur only at multiples of the base frequency. Such a relationship enables use of a bandpass filter to filter out the spurious frequencies without sacrificing the step size for tuning the output frequency. By filtering out the spurious frequencies, rather than attenuating the current drive, the trade-off with phase noise is eliminated. Thus, spurious frequencies may be substantially reduced or eliminated without adversely impacting the phase noise.

According to another aspect of the invention, the desired output frequency may be changed by varying any one or more of the base frequency, the mixer harmonic, or the programmable divider factors. Changes to the mixer harmonic are used to achieve large step increments/decrements. Changes to any one or more of the divider factors are used to achieve smaller step increments/decrements. Fine step increments/decrements are achieved by varying the base frequency. By allowing large changes, small changes and fine tuning changes, the synthesizer may operate over a wide operating range.

According to another aspect of the invention, variable step size is achieved by including a direct digital synthesizer ("DDS") in the base frequency source. Such base frequency source is configured so that the spurious frequencies signal levels of the DDS do not affect the spurious rejection performance of the synthesizer as a whole. Such an approach enables the step size to be as low as the milli-hertz range. Thus, high resolution of the output frequency may be achieved. Further, the varying step size enables different step sizes to be used for different applications of the invention. Accordingly, hardware design changes are not needed to vary the step size, as in the prior art. Thus, the recurring engineering changes and resultant expenses of prior systems are avoided.

The invention will be better understood by reference to the following detailed description taken in conjunction with the accompanying drawings.

DESCRIPTION OF SPECIFIC EMBODIMENTS

Overview

Figure 1:
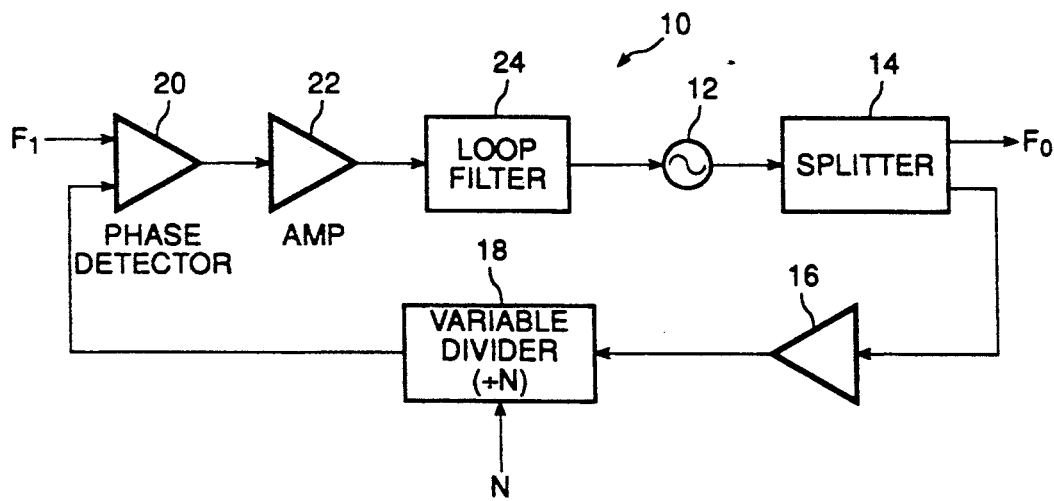
FIG. 1 is a block diagram of a conventional frequency synthesizer.
Figure 2:
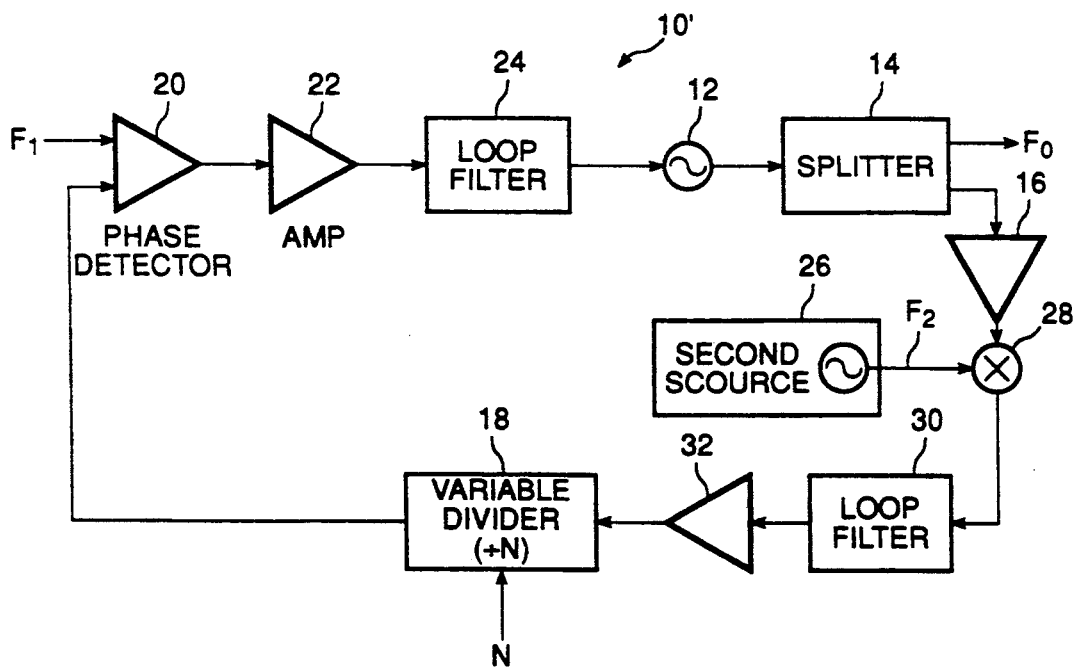
FIG. 2 is a block diagram of another conventional frequency synthesizer.
Figure 3:
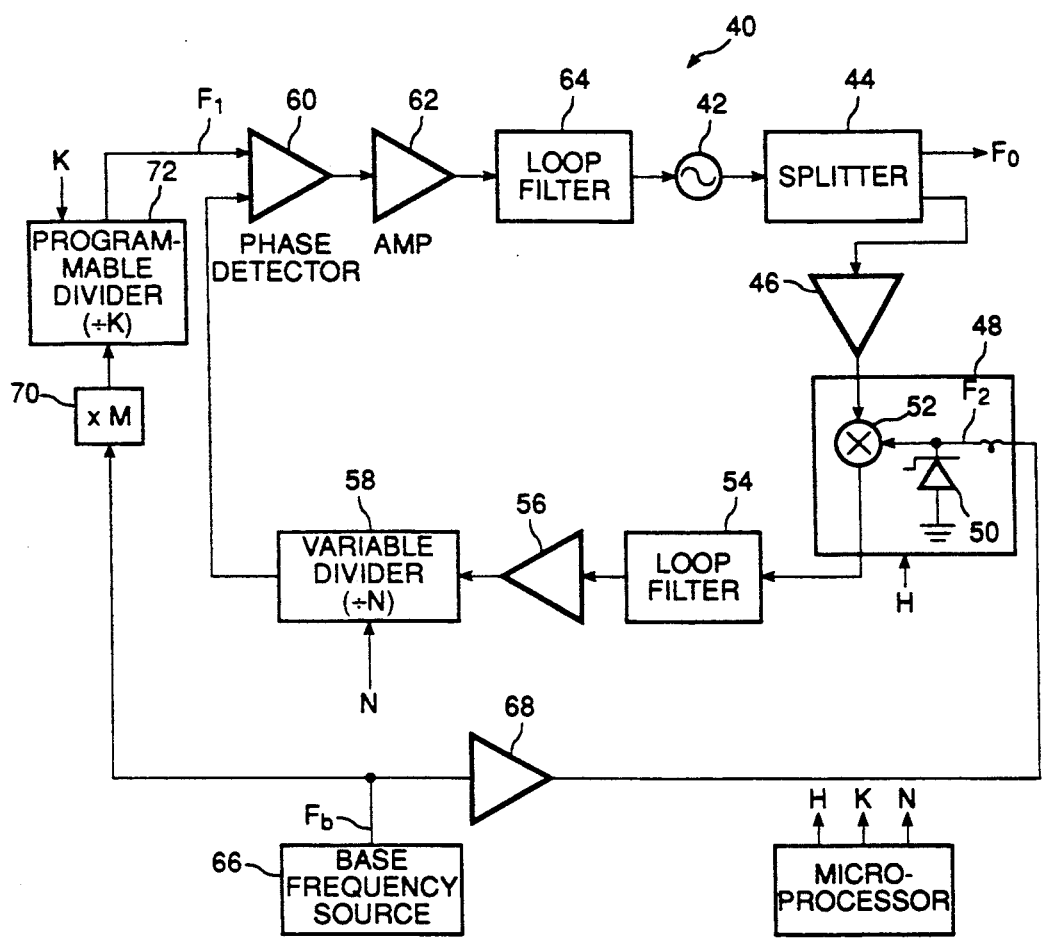
FIG. 3 is a block diagram of a frequency synthesizer according to an embodiment of this invention.

A frequency synthesizer 40 according to an embodiment of this invention is shown in FIG. 3. The frequency synthesizer 40 generates a select stable output frequency from a plurality of reference frequencies and programmable inputs. Tuning of the output frequency is achieved in step sizes of variable increments according to the reference frequencies and programmed parameters. The synthesizer 40 includes an oscillator 42 which generates an output signal $F_0$. The oscillator preferably is a magnetically-tuned YIG oscillator. The output signal, $F_0$, is split at a power splitter 44, or other splitting device, so as to feed back into a buffer 46 and harmonic mixer 48.

The harmonic mixer includes a step-recovery diode 50 and a mixing element 52. The mixer 48 receives a harmonic select signal H and a base frequency, $F_b$. The diode 50 generates a reference harmonic of the base signal, $F_b$, based on the harmonic select signal H. The result is a reference frequency, $F_2$, which is input to the mixing element 52. Element 52 mixes the output frequency $F_0$ with the reference frequency $F_2$.

Figure 4:
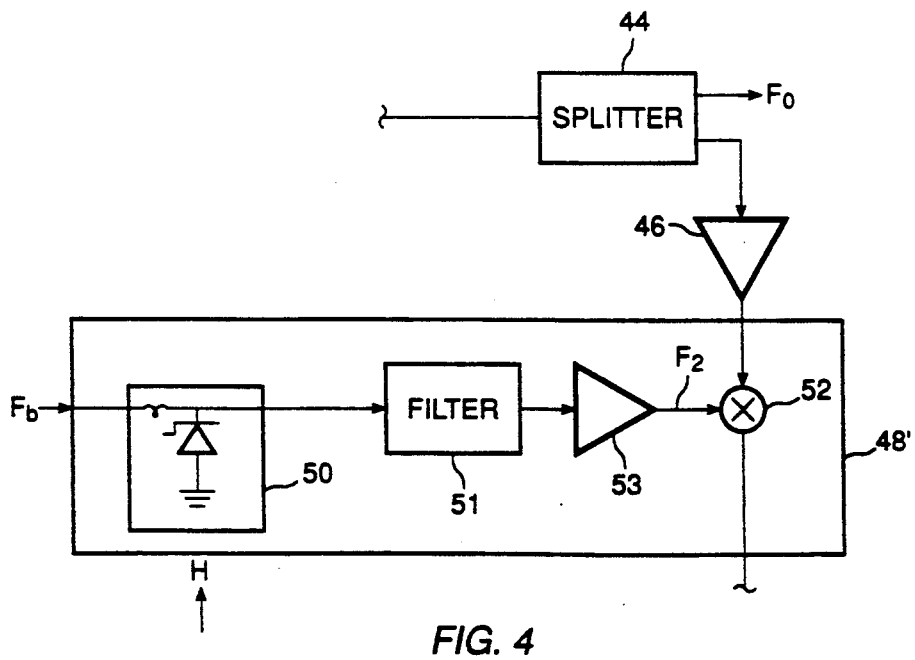
FIG. 4 is an alternative embodiment of the harmonic mixer of FIG. 3.

FIG. 4 shows an alternative embodiment 48' of the harmonic mixer 48. The mixer 48' receives the base frequency signal $F_b$ into the step-recovery diode 50 and the diode 50 generates the reference harmonic, as previously described. The reference frequency $F_2$, however, is input to a fixed or tunable band-pass filter 51 and a buffer 53 before entering the mixer 52.

Referring again to FIG. 3, element 52 mixes the output frequency $F_0$ with the reference frequency $F_2$ generating a signal input to a filter 54. Such filter preferably is a low pass or band pass filter. The filtered, mixed signal then is received into a buffer 56, then an optional programmable frequency divider 58. The divider 58 is programmed with a division signal N causing the filtered, mixed signal to be frequency divided by the factor N. The divided signal then is input to a phase detector 60.

The phase detector 60 also receives a first reference frequency, $F_1$, resulting in a phase-referenced output which is coupled to the oscillator 42 through a buffer 62 and filter 64. The phase-referenced output tunes the oscillator 42 to generate the output signal, $F_0$, at a desired frequency.

As shown, the first and second reference frequencies, $F_1$ and $F_2$ are derived from the base frequency, $F_b$. A base frequency source 66 generates the base frequency signal $F_b$. Such base frequency signal is input to the harmonic mixer 48 via a buffer 68. The base frequency signal also is input to a multiplier 70 and a programmable divider 72 for converting the base frequency to the first reference frequency, $F_1$. The multiplier 70 preferably has a fixed multiple M, although a programmable multiplier could be used. The divider 72 receives a division signal k.

A microprocessor is included for tuning the oscillator 40. The microprocessor generates the harmonic select signal H and the division signals N and K.

Base Frequency Source

Figure 5:
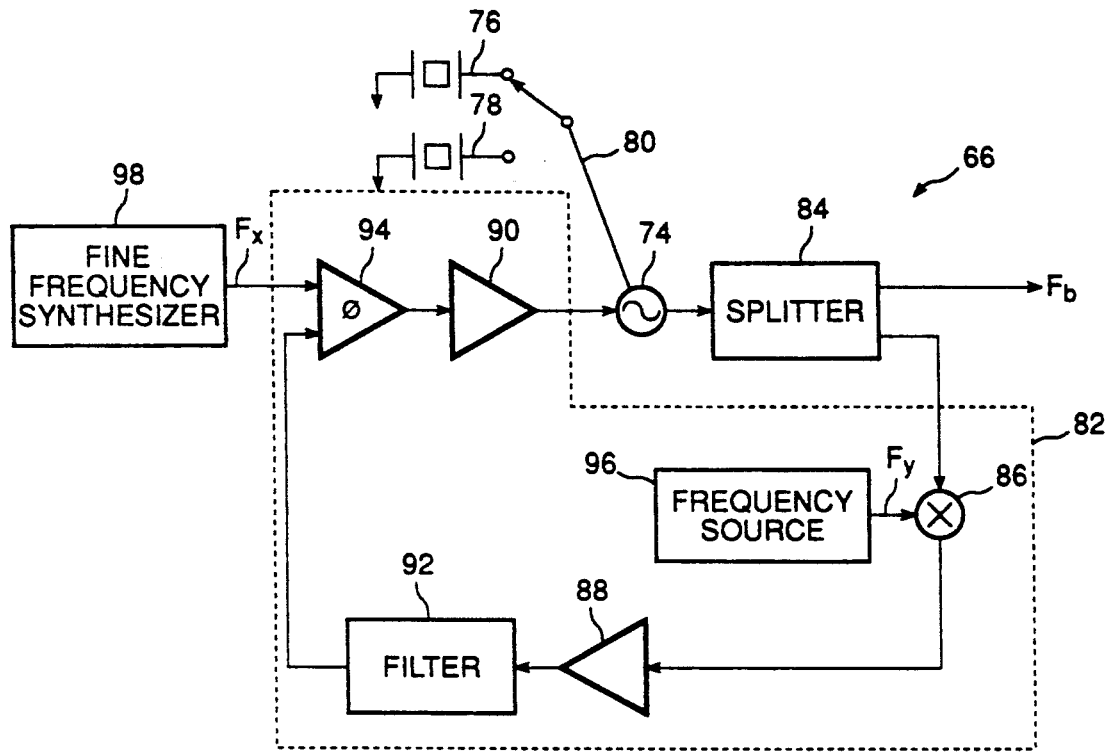
FIG. 5 is a block diagram of the base frequency source for the synthesizer of FIG. 3.

A first embodiment of the base frequency source 66 is shown in FIG. 5. The source 66 includes a voltage controlled oscillator 74 selectively coupled to one of two crystals 76, 78 through a switch 80. The oscillator 74 also receives tuning signal from a phase locked loop circuit 82. The oscillator 74 generates the base frequency $F_b$, which is input to a signal splitter 84 and fed back into the phase locked loop circuit 82.

The phase locked loop circuit 82 includes a mixing element 86, buffers 88, 90, a low-pass or band-pass filter 92, a phase detector 94 and a reference frequency source 96. The source 96 may be a fixed, switched or other frequency source for generating a reference frequency $F_y$. The element 86 mixes the base frequency signal feedback with the reference frequency $F_y$. The mixed signal then is buffered and filtered, and input to the phase detector 94. The phase detector 94 also receives a reference frequency $F_x$ from a fine-tuning frequency synthesizer 98. The filtered, mixed signal is phase referenced to the reference signal $F_x$ to generate a tuning signal for the voltage controlled oscillator 74.

Figure 6:
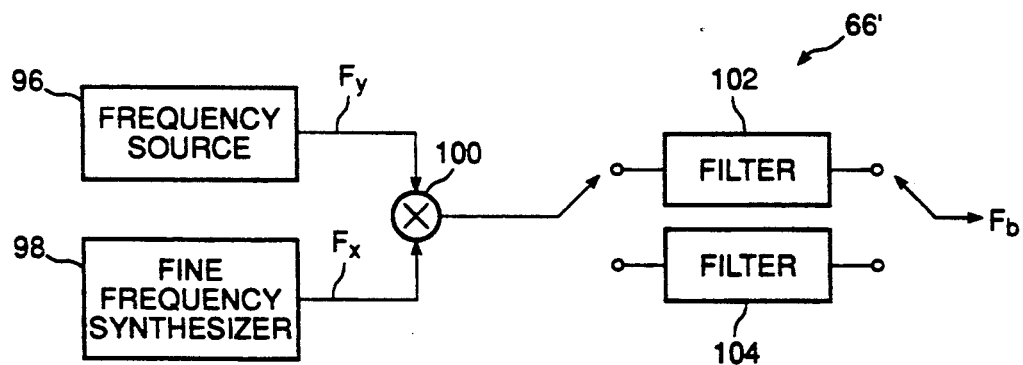
FIG. 6 is an alternative embodiment of the base frequency source of FIG. 3.

FIG. 6 shows an alternate embodiment 66' for the base frequency source 66. Source 66' includes the fixed frequency source 96 and the fine-tuning frequency synthesizer 98. The respective reference frequencies $F_x$ and $F_y$ are mixed at element 100. The mixed reference then is filtered and output as the base frequency signal $F_b$. Alternative loop or band-pass filters 102, 104 may be switched to receive the mixer 100 output so as to produce the base frequency signal $F_b$.

Fine-Tuning Frequency Synthesizer 98

Figure 7:
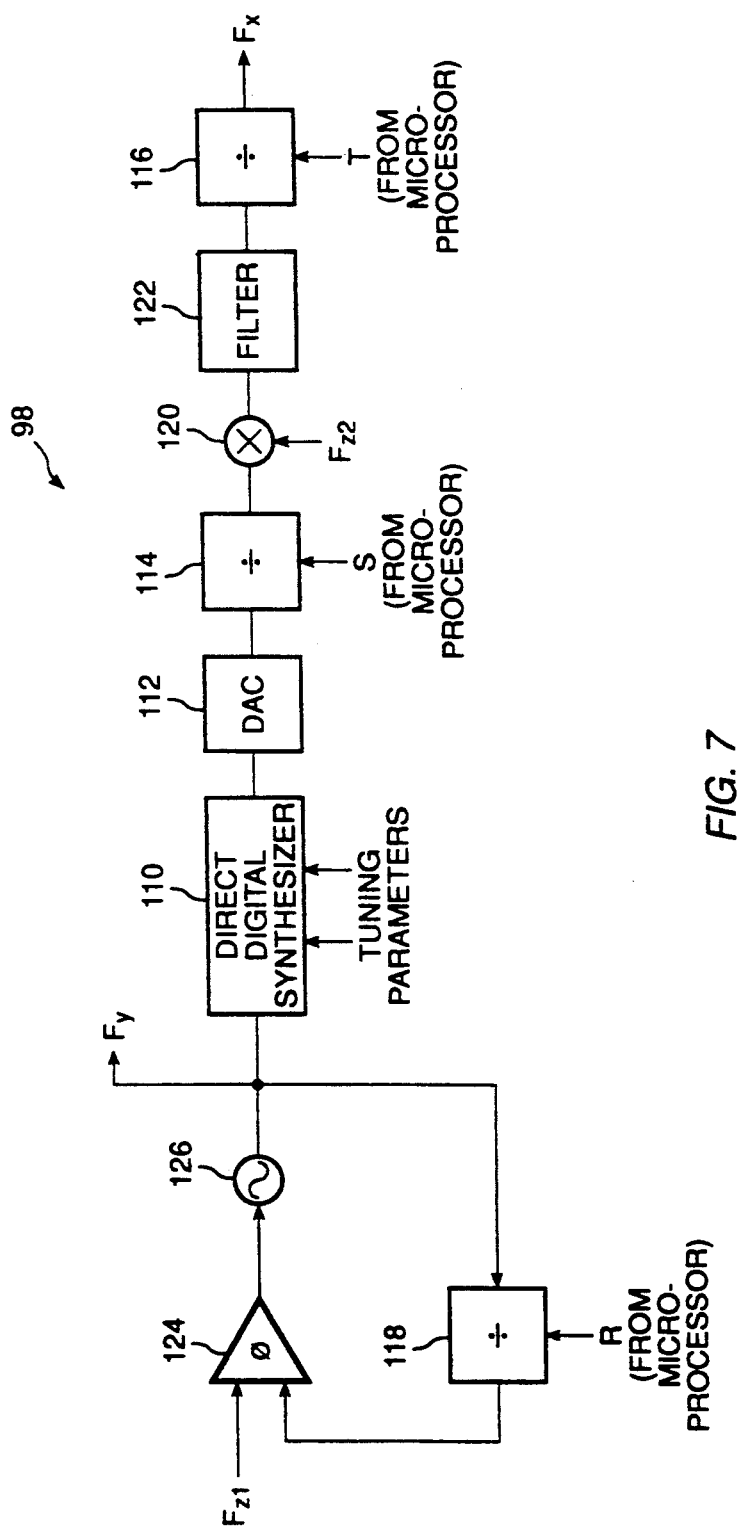
FIG. 7 is a block diagram of the fine tuning frequency synthesizer portion of the base frequency source of FIGS. 5 and 6.

FIG. 7 shows an embodiment for the fine-tuning frequency synthesizer 98. The fine-tuning synthesizer 98 generates the reference frequency $F_x$ of the base frequency source 66. Variations to the frequency $F_x$ are used to fine tune the synthesizer 40 according to an embodiment of this invention. The synthesizer 98 includes a conventional direct digital synthesizer 110, a digital to analog converter 112, programmable dividers 114, 116, and 118, mixer 120, loop or band-pass filter 122, phase detector 124 and oscillator 126.

Oscillator 126 generates a signal fed into the direct digital synthesizer ("DDS") 110. The DDS 110 receives tuning parameters for determining the output frequency and step size of the DDS. The digital output signal then is converted to an analog signal at DAC 112, then divided by a divider 114. The divider 114 receives a programmable divider signal S. The divided analog signal then is mixed with a frequency reference signal $F_{z2}$, then filtered, divided and output as the reference frequency $F_x$. The final division is performed by a programmable divider 116 which receives a division factor signal T. The reference signals $F_{z1}$ and $F_{z2}$ preferably are generated by fixed frequency sources, although more complex switchable or variable frequency configurations also may be used. The contribution of the DDS 110 to the synthesizer 40 spurious and phase noise performance is reduced by the division ratio $1/(S \times T)$.

Referring again to oscillator 126, the output also is fed back through a programmable divider 118 into a phase detector circuit 124. The divider 118 receives a programmable division signal, R. The phase detector 124 references the divided signal with a reference frequency $F_{z1}$.

In addition, the oscillator 126 output may be coupled to the mixer 86 of the base frequency source 66 to generate the reference frequency $F_y$ and thus form the frequency source 96.

Alternative Embodiments of the Fine Frequency Synthesizer

In place of the preferred DDS embodiment of FIG. 7, the fine-tuning frequency synthesizer 98 may be formed as a multi-loop synthesizer or a fractional N synthesizer, or other known synthesizer.

Figure 8:
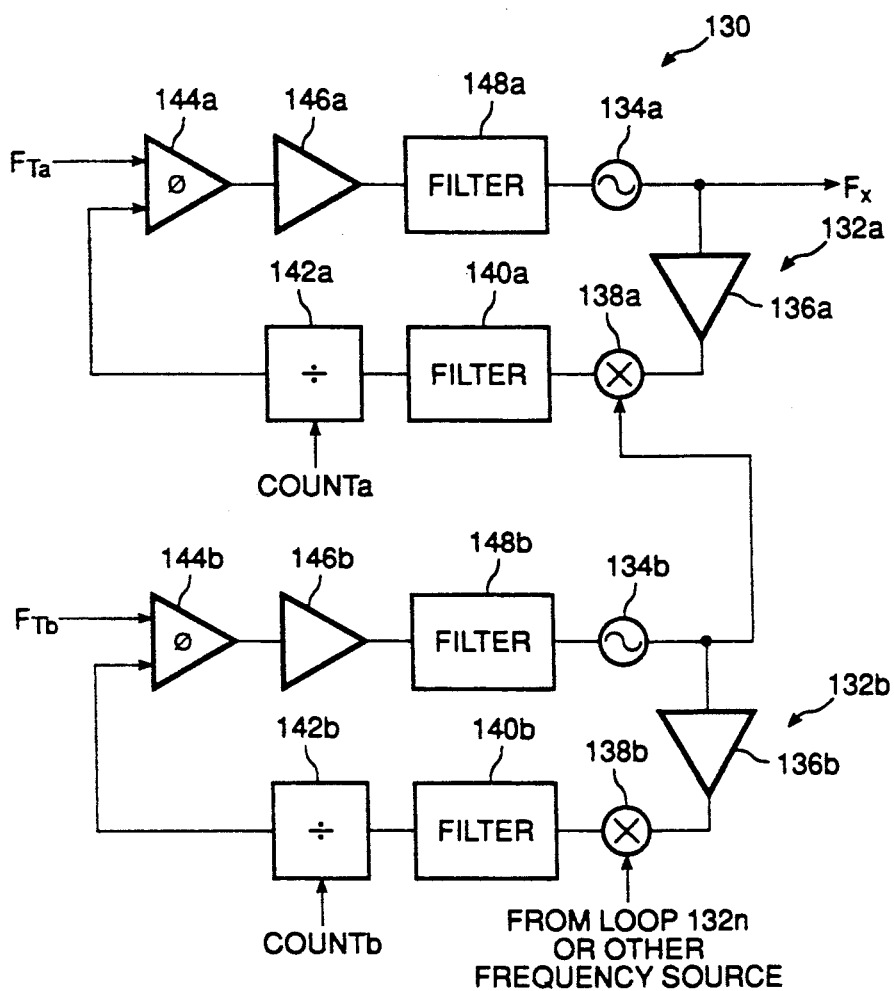
FIG. 8 is a block diagram of an alternate embodiment of the fine tuning frequency synthesizer.

FIG. 8 shows a multi-loop synthesizer embodiment 130. The synthesizer 130 generates the reference frequency $F_x$ for the base frequency source 66, and includes n loops 132. Each loop 132 includes a voltage controlled oscillator 134 coupled to a phase locked loop. The oscillator 134a generates the output signal $F_x$. Such output is fedback into the phase locked loop at a buffer 136a to a mixer 138a. The mixer 138a receives a reference frequency which is the output from the next loop 132b. The mixer 138a mixes the feedback signal $F_x$ and the signal from the next loop 132b, then outputs the result to a low-pass or band-pass filter 140a, then a programmable frequency divider 142a. The divider 142a receives a programmable count signal Count. The divided result then is input to phase detector 144a which also receives a reference signal $F_{Ta}$. A phase referenced result then is buffered at buffer 146a, filtered at low-pass or band-pass filter 148a and input to the oscillator 134a as a tuning signal. Each loop 132i is similarly structured with the nth loop receiving a reference frequency into mixer 132n from another source (not shown).

Figure 9:
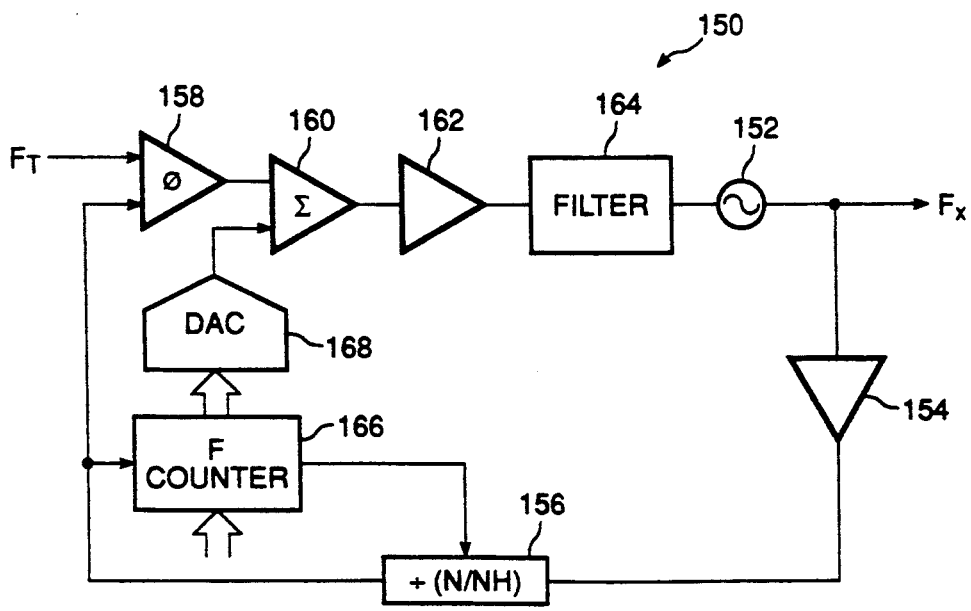
FIG. 9 is a block diagram of still another embodiment of the fine tuning frequency synthesizer.

FIG. 9 shows a fractional N synthesizer embodiment 150 of the fine tuning frequency synthesizer 98. The synthesizer 150 includes a voltage controlled oscillator 152 which generates the frequency signal $F_x$. Such signal is fed back through buffer 154 to a divider circuit 156 programmed to perform a $(D/D+1)$ operation where D is programmed. The divider 156 also receives a modulus control signal with the resulting output coupled to a phase detector 158. The phase detector 158 also receives a reference frequency $F_T$. A phase referenced result, then is input to a summing circuit 160. The output of the summing circuit 160 is buffered at buffer 162 and filtered at filter 164 with the result coupled to the oscillator 150 as a tuning signal. The summing circuit 160 also receives a cancelling waveform from an F counter 166 through a digital to analog converter (DAC) 168. The counter 166 is programmable, clocked by the divider 156 output and provides a modulus control signal (i.e., carry) to the divider 156.

Tuning the Synthesizer 40

The synthesizer 40 is tuned by altering any of the programmable signals H, N or K or by altering the base frequency $F_b$. For large increments or decrements in the output frequency, the harmonic select signal H may be altered. For smaller increments or decrements, the division factor signals K or N may be varied. For fine tuning of the oscillator 42, the base frequency, $F_b$, is altered. In practice, one or more of the signals H, N, K, $F_b$ are varied to select the desired frequency of the output signal $F_0$.

Referring to FIGS. 5 and 7, the base frequency is altered by switching between crystals 76, 78 (FIG. 5), or by adjusting the division factor signals R, S, or T or the DDS tuning parameters (FIG. 7). According to one embodiment, a microprocessor is used for tuning the synthesizer 40. As shown in FIG. 3, the microprocessor 65 generates the signals H, K and N. In addition, the microprocessor 65 generates the signals R, S, T and the DDS tuning parameters.

Figure 10:
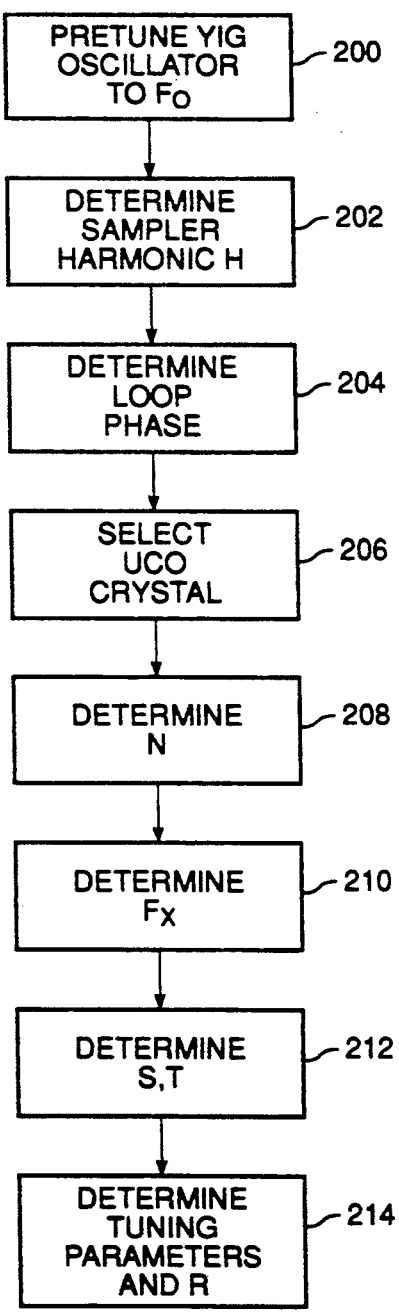
FIG. 10 is a flow chart for tuning the synthesizer 40.

FIG. 10 shows a flow chart for programming the synthesizer 40 for an embodiment including the FIG. 7 fine-tuning synthesizer 98. Such process is performed in part by the microprocessor 65.

At step 200, the YIG oscillator 42 is pretuned to the desired frequency $F_0$. Then, at step 202 the harmonic signal H is determined for the harmonic mixer 48 based on the equation:

$$H = \text{Greatest Integer portion of } [(F_0/150) + 0.5];$$

where $F_0$ is in MHz.

At step 204, the loop phase is determined. The phase is $+1$, if the fractional portion of $[(F_0/150)+0.5]$ is greater than 0.5, and is $-1$ otherwise.

At step 206, the crystal 76, 78 for the voltage controlled oscillator 74 is selected. For a loop phase of $+1$, one of crystals 76, 78 (xtal=1) is selected if $F_0 > H \times (150 + d - t) + F_{x-min}$, and the other crystal 78, 76 (xtal=$-1$) is selected otherwise; where d equals the frequency difference between crystals 76 and 78, t is a tuning range constant for the oscillator 74 and $F_{x-min}$ is the minimum frequency for reference frequency $F_x$. For a loop phase of $-1$, one of crystals 78, 76 (xtal=$-1$) elected if $F_0 < H \times (150 - d + t) - F_{x-min}$, and the other crystal 76, 78 (xtal=1) is selected otherwise.

At step 208, the division signal, N, for programmable divider 58 is determined using the equation:

$$N = (P \times 600)/[F_0 - H(150 + xtal \times d)]$$

N is rounded as follows:
N=N5; if N<N5
N=nearest half integer; if N5<N<N4
N=nearest half integer; if N4<N<N3
N=nearest integer; if N3<N<N2
N=nearest even integer; N2<N<N3
N=N1; if N>N1

Typical values for N1-N5 are: N5=11; N4=13.5; N3=18; N2=26; and N1=46.

At steps 210, 212 and 214, the base frequency, $F_b$, is adjusted. At step 210 divider 72 is programmed with a division factor of k=2 and the frequency $F_x$ is identified.

$$F_x = (xtal/H) \times [F_0 - 150H - P(600 \ k/N)]$$

At step 212, programmable dividers 114 and 116 respectively receive count signals S and T, based on the equations:

$$S = \text{greatest integer for } [(42.8/F_x) + 0.5]$$

$$T = \text{greatest integer for } 0.5 + 11/[(F_x \times S/4) - 10]$$

At step 214 the DDS 110 is tuned with tuning parameters and the divider 118 signal R is set to achieve a DDS frequency of $F_{DDS} = T \times F_x$.

Conclusion

The performance of a synthesizer according to an embodiment of this invention is compared to a conventional telecom/satcom synthesizer and an instrument synthesizer in the table below:

TABLE 1

| Parameter | Synthesizer 40 | Telecom/Satcom | Instrument |
| --- | --- | --- | --- |
| Range (GHz) | 2–26.5 | 1–23 | .01–26.5 |
| Freq. Coverage | >1 GHz | 100–500 MHz | Full |
| Phase Noise (dBc/Hz) | <−120 | −100 | −95 |
| Spurious (dBc) | <−85 | −75 | −60 to −75 |
| Tuning Speed (msec) | 10 | >100 | >100 |
| Freq. Resolution | mHz to MHz | 10 kHz | 1 Hz–1 MHz |
| Power (Watts) | 15 | >20 | 250–300 |
| Size/Volume (Cu. in.) | 32 | >100 | 19" rack |
| Op. Temp. (Celsius) | 0–60 | 0–50 | 0–55 |

Although a preferred embodiment of the invention has been illustrated and described, various alternatives, modifications and equivalents may be used. For example, by substituting octave, multi-octave or decade tuning YIG sources, the synthesizer may be used for other frequency ranges. In addition with output frequency doubling, the range of the synthesizer 40 can extend beyond 50 gHz. With output division to lower frequencies, exceptional phase noise performance is sustained for reduced frequencies. In addition, various analog to digital converters and digital to analog converters are included where appropriate. Filter ranges (i.e., microwave, radio or infared frequency ranges) are determined according to the specific embodiment. Therefore, the foregoing description should not be taken as limiting the scope of the inventions which are defined by the appended claims.

What is claimed is:

1. A frequency synthesizer for generating an output signal of a desired frequency, comprising:
   a tunable oscillation means for generating an output signal;
   means for deriving a stable base frequency signal from a fixed frequency reference standard;
   means coupled to the base frequency deriving means for generating a first reference frequency signal from said base frequency signal, the frequency of said first reference frequency signal being a programmable integral fraction of an integral multiple of said stable base frequency;
   means coupled to said base frequency deriving means for generating a second reference frequency signal from said stable base frequency, the frequency of said second reference frequency signal being a harmonic of said stable base frequency;

means coupled to said tunable oscillator means and to said second reference frequency generating means for mixing said output signal with said second reference frequency signal to generate a mixed signal; and means for phase locking the mixed signal to said first reference frequency signal by producing an error signal for controlling said tunable oscillation means, the error signal being coupled to said tunable oscillation means for tuning said tunable oscillation means to generate said output signal at the desired frequency.

2. The synthesizer of claim 1, further comprising programmable means for frequency dividing the mixed signal before being input to the referencing means.

3. The synthesizer of claim 1 in which the first reference frequency signal generating means comprises: means for frequency multiplying and programmable means for frequency dividing said stable base frequency to produce said first reference frequency signal.

4. The synthesizer of claim 2, further comprising means for rejecting unwanted harmonics of the base frequency for the second reference frequency.

5. The synthesizer of claim 4 in which the rejecting means comprises a comb filter.

6. The synthesizer of claim 1 in which the tunable oscillation means is a magnetically-tuned YIG oscillator.

7. The synthesizer of claim 1 in which said base frequency deriving means comprises:
a second tunable oscillation means for generating said base frequency;
means for generation a third reference frequency signal, the frequency of said third reference frequency signal being fixed;
means for generating a fourth reference frequency signal;
means for mixing said base frequency with said third reference frequency to generate a mixed base signal;
means for filtering said mixed base signal to produce a filtered base signal;; and
means for phase locking the filtered base signal to said fourth reference frequency by producing a reference error signal for controlling said second tunable oscillation means, the the reference error signal being coupled to the second tunable oscillation means for tuning the second tunable oscillation means to generate said base frequency signal.

8. The synthesizer of claim 7, wherein said second tunable oscillation means is a voltage controlled crystal oscillator and further comprising a plurality of crystals and means for selectively coupling one of said plurality of crystals to said second tunable oscillation means.

9. The synthesizer of claim 7 in which said fourth reference frequency generating means comprises a direct digital synthesizer receiving a tuning parameter signal.

10. The synthesizer of claim 9 in which the fourth reference frequency generating means further comprises first means for programmably dividing output from the direct digital synthesizer to produce a stable divided signal.

11. The apparatus of claim 10 further comprising means for mixing the stable divided signal with a fixed signal to produce a mixed stable signal, means coupled to said mixing means for filtering spurious signals from the mixed stable signal to produce a filtered signal and second means coupled to said filtering means for programmably dividing the filtered signal to produce said fourth reference frequency signal.

12. The synthesizer of claim 7 in which said fourth reference frequency generating means comprises a fractional-n synthesizer.

13. The synthesizer of claim 7 in which said fourth reference frequency generating means comprises a multi-loop synthesizer.

14. The synthesizer of claim 1 in which said base frequency means comprises:
a fixed third frequency source;
a programmable fourth frequency source;
means for mixing the signal of the third frequency source and the signal of the fourth frequency signal for generating a second mixed signal;
second means for filtering said second mixed signal to select one mixed product as said base frequency signal.

15. The synthesizer of claim 14 in which said second filter means comprises a plurality of filters and means for selecting one of said plurality of filters.

16. A method for generating a phase-locked output signal at a desired frequency with a frequency synthesizer, comprising the steps of:
generating a tunable oscillation output signal from a tunable oscillation means;
deriving a stable base frequency signal from a fixed frequency reference standard;
generating a first reference frequency signal from said base frequency signal, the frequency of said first reference frequency signal being programmable integral fraction of an integral multiple of said stable base frequency;
generating a second reference frequency signal from said stable base frequency, the frequency of said second reference frequency signal being a harmonic of said stable base frequency;
mixing said output signal with said second reference frequency signal to generate a mixed signal; and
phase locking the mixed signal to said first reference frequency signal by producing an error signal for controlling said tunable oscillation means, the error signal being coupled to said tunable oscillation means for tuning said tunable oscillation means to generate said output signal at the desired frequency.

17. The method of claim 16 further comprising the step of frequency dividing the mixed signal before said step of referencing.

18. The method of claim 16 in which the step of deriving the first reference frequency comprises the steps of frequency multiplying and frequency dividing said stable base frequency to produce said first reference frequency signal.

19. The method of claim 16 in which the step of generating a stable base frequency comprises the steps of:
generating a base frequency with a second tunable oscillation means;
generating a third reference frequency signal, the frequency of said third reference frequency signal being fixed;
generating a fourth reference frequency signal, the frequency of the fourth reference frequency being programmable;
mixing said base frequency signal with said third reference frequency signal to generate a mixed base signal;

filtering said mixed base signal to generate a filtered base signal; and phase locking the filtered base signal to said fourth reference frequency by producing a reference error signal for controlling said second tunable oscillation means, the reference error signal being coupled to second tunable oscillation means for tuning the second tunable oscillation means to generate said stable base frequency signal.

* * * * *